US011419251B2

(12) United States Patent
Oyama et al.

(10) Patent No.: US 11,419,251 B2
(45) Date of Patent: Aug. 16, 2022

(54) COMPONENT MOUNTING DEVICE

(71) Applicant: FUJI CORPORATION, Chiryu (JP)

(72) Inventors: Shigeto Oyama, Kariya (JP); Jun Iisaka, Nisshin (JP); Hideya Kuroda, Toyota (JP)

(73) Assignee: FUJI CORPORATION, Chiryu (JP)

( * ) Notice: Subject to any disclaimer, the term of this patent is extended or adjusted under 35 U.S.C. 154(b) by 281 days.

(21) Appl. No.: 16/487,119

(22) PCT Filed: Feb. 23, 2017

(86) PCT No.: PCT/JP2017/006789
§ 371 (c)(1),
(2) Date: Aug. 20, 2019

(87) PCT Pub. No.: WO2018/154673
PCT Pub. Date: Aug. 30, 2018

(65) Prior Publication Data
US 2019/0380237 A1    Dec. 12, 2019

(51) Int. Cl.
*H05K 13/08* (2006.01)
*H05K 13/04* (2006.01)
*B25J 15/06* (2006.01)

(52) U.S. Cl.
CPC ...... *H05K 13/0812* (2018.08); *B25J 15/0616* (2013.01); *H05K 13/0409* (2018.08)

(58) Field of Classification Search
CPC ............. B25J 15/0616; H05K 13/0409; H05K 13/041; H05K 13/0812
See application file for complete search history.

(56) References Cited

U.S. PATENT DOCUMENTS 5,544,411 A * 8/1996 Kano ................. H05K 13/0409
29/740
5,588,195 A * 12/1996 Asai ................... H05K 13/0413
29/33 M
(Continued)

FOREIGN PATENT DOCUMENTS

EP    1 154 014 A1    11/2001
EP    1 521 515 A2     4/2005
(Continued)

OTHER PUBLICATIONS

Extended European Search Report dated Feb. 3, 2020 in European Patent Application No. 17897279.0, 8 pages.
(Continued)

*Primary Examiner* — Minh N Trinh
(74) *Attorney, Agent, or Firm* — Oblon, McClelland, Maier & Neustadt, L.L.P.

(57) ABSTRACT

A component mounting device includes multiple selector valves corresponding individually to multiple holders disposed on a rotary head and switching between making and breaking communication between a corresponding holder flow path and a negative pressure source, and valve driving devices driving selector valves corresponding to holders, among the multiple holders, located in predetermined revolving positions. The component mounting device executes a negative pressure recovery operation when a suction error has occurred in which the component is not held by suction to the nozzle after suction operation. When a suction error occurs at the nozzle held by the holder, the component mounting device performs the negative pressure recovery operation by waiting for the holder to be rotated to a predetermined revolving position and drives the selector valve corresponding to the holder using the valve driving (Continued)

device to cut off communication between the holder flow path and the negative pressure source.

9 Claims, 9 Drawing Sheets

(56) References Cited

U.S. PATENT DOCUMENTS

| | | | | |
|---|---|---|---|---|
| 5,926,950 | A * | 7/1999 | Asai | H05K 13/0812 29/832 |
| 6,154,954 | A * | 12/2000 | Seto | H05K 13/041 29/740 |
| 7,950,145 | B2 * | 5/2011 | Okuda | H05K 13/0812 29/834 |
| 9,109,986 | B2 | 8/2015 | Nishiyama | |
| 2005/0102826 | A1 * | 5/2005 | Asai | H05K 13/0812 29/743 |
| 2014/0353995 | A1 * | 12/2014 | Nishiyama | H05K 13/082 294/185 |
| 2019/0380237 | A1 * | 12/2019 | Oyama | H05K 13/041 |

FOREIGN PATENT DOCUMENTS

| | | |
|---|---|---|
| JP | 3128406 B2 | 1/2001 |
| JP | 3413425 B2 | 6/2003 |
| JP | 2007-36162 A | 2/2007 |
| JP | 6177342 B2 | 8/2017 |
| WO | WO 2013/145228 A1 | 10/2013 |
| WO | WO 2015/001633 A1 | 1/2015 |

OTHER PUBLICATIONS

International Search Report dated May 23, 2017 in PCT/JP2017/006789 filed on Feb. 23, 2017.

* cited by examiner

FIG. 8

(A) HOLDER A SUCKING COMPONENT

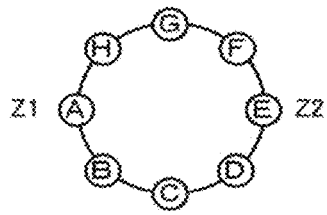

(B) HOLDER B SUCKING COMPONENT, HOLDER A SUBJECT TO COMPONENT PRESENCE/ABSENCE DETERMINATION

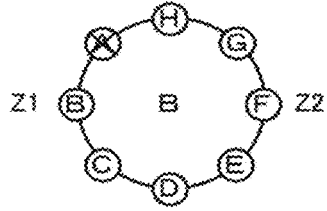

(C) HOLDER C SUCKING COMPONENT, HOLDER B SUBJECT TO COMPONENT PRESENCE/ABSENCE DETERMINATION

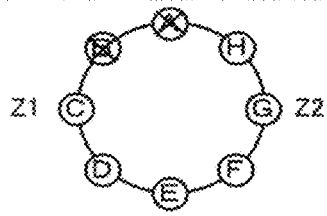

(D) HOLDER D SUCTION SKIPPED, HOLDER C SUBJECT TO COMPONENT PRESENCE/ABSENCE DETERMINATION

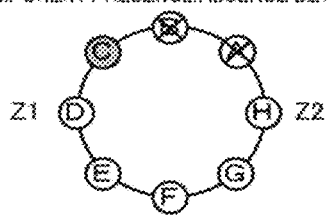

(E) HOLDER A VALVE CLOSED, HOLDER E SUCKING COMPONENT

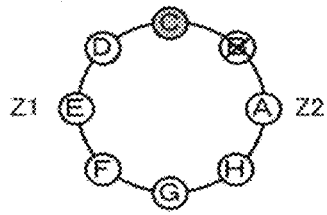

(F) HOLDER B VALVE CLOSED, HOLDER F SUCKING COMPONENT, HOLDER E SUBJECT TO COMPONENT PRESENCE/ABSENCE DETERMINATION

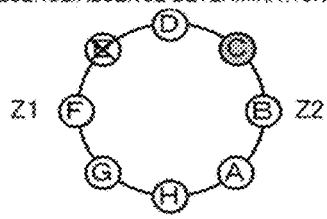

(G) HOLDER G SUCING COMPONENT, HOLDER F SUBJECT TO COMPONENT PRESENCE/ABSENCE DETERMINATION

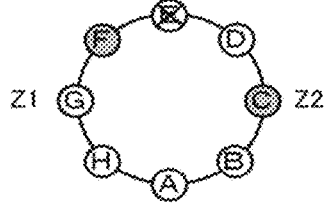

(H) HOLDER H SUCKING COMPONENT, HOLDER G SUBJECT TO COMPONENT PRESENCE/ABSENCE DETERMINATION

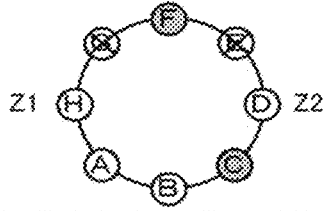

(I) HOLDER E VALVE CLOSED, HOLDER A SUCKING COMPONENT, HOLDER H SUBJECT TO COMPONENT PRESENCE/ABSENCE DETERMINATION

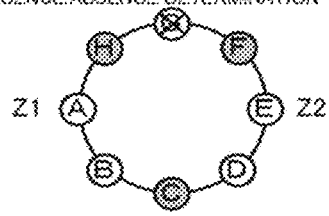

(J) HOLDER B SUCKING COMPONENT, HOLDER A SUBJECT TO COMPONENT PRESENCE/ABSENCE DETERMINATION

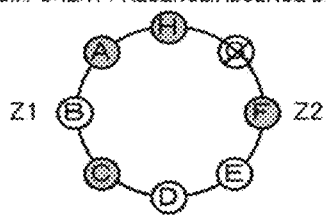

(K) HOLDER G VALVE CLOSED, HOLDER B SUBJECT TO COMPONENT PRESENCE/ABSENCE DETERMINATION

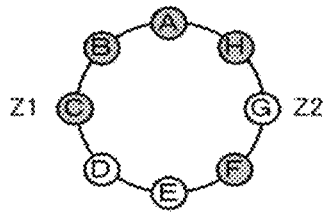

(L) HOLDER D SUCKING COMPONENT

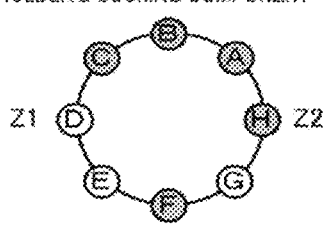

FIG. 9
(M) HOLDER E SUCKING COMPONENT, HOLDER D SUBJECT TO COMPONENT PRESENCE/ABSENCE DETERMINATION
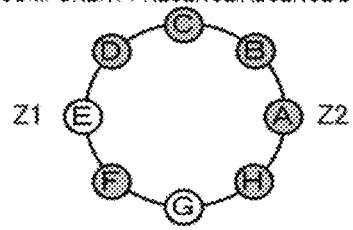
(N) HOLDER E SUBJECT TO COMPONENT PRESENCE/ABSENCE DEERMINATION
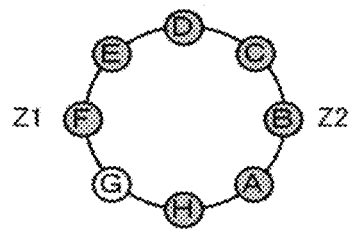
(O) HOLDER G SUCKING COMPONENT
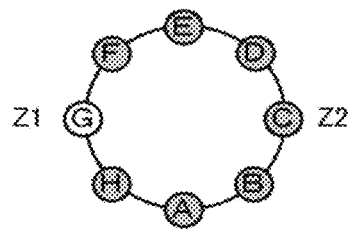
(P) HOLDER G SUBJECT TO COMPONENT PRESENCE/ABSENCE DETERMINATION
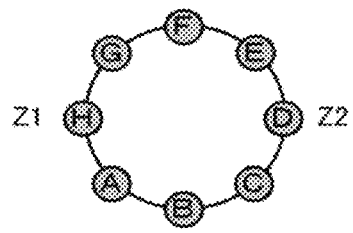
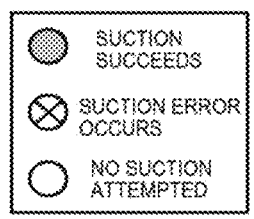

FIG. 10

(A) HOLDERS A, E SUCTING COMPONENT
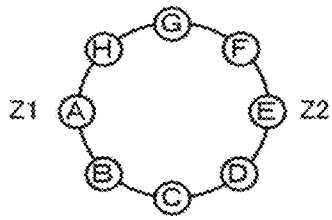

(B) HOLDERS B, F SUCKING COMPONENT, HOLDERS A, E SUBJECT TO COMPONENT PRESENCE/ABSENCE DETERMINATION
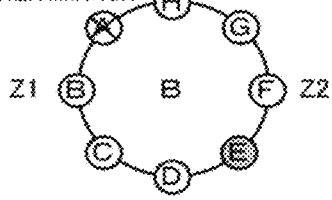

(C) HOLDERS C, G SUCTION SKIPPED, HOLDERS B, F SUBJECT TO COMPONENT PRESENCE/ABSENCE DETERMINATION
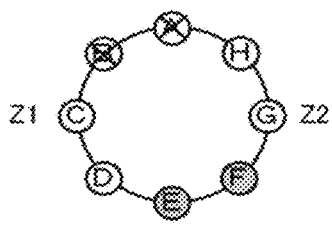

(D) HOLDERS D, H SUCTION SKIPPED
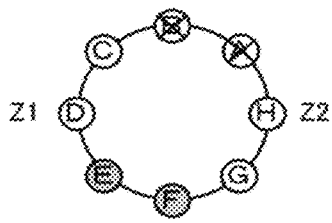

(E) HOLDER A VALVE CLOSED
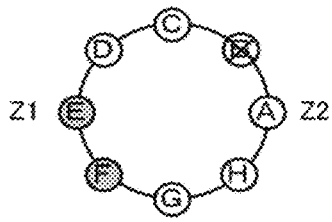

(F) HOLDER B VALVE CLOSED
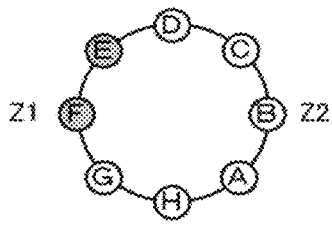

(G) HOLDERS C, G SUCKING COMPONENT
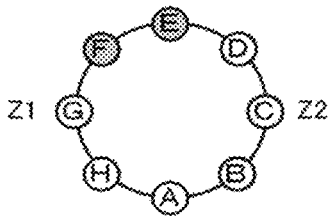

(H) HOLDERS H, D SUCKING COMPONENT, HOLDERS C, G SUBJECT TO COMPONENT PRESENCE/ABSENCE DETERMINATION
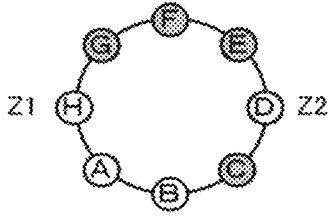

(I) HOLDER A SUCKING COMPONENT, HOLDERS H, D SUBJECT TO COMPONENT PRESENCE/ABSENCE DETERMINATION
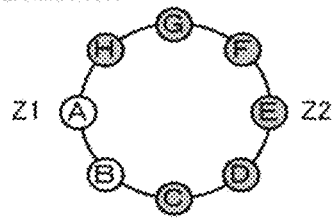

(J) HOLDER B SUCKING COMPONENT, HOLDER A SUBJECT TO COMPONENT PRESENCE/ABSENCE DETERMINATION
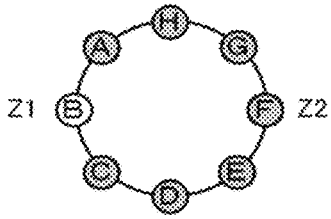

(K) HOLDER B SUBJECT TO COMPONENT PRESENCE/ABSENCE DETERMINATION
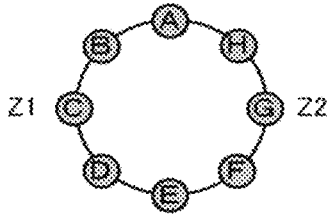

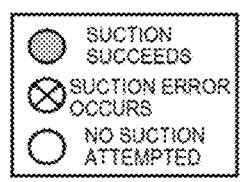
SUCTION SUCCEEDS
SUCTION ERROR OCCURS
NO SUCTION ATTEMPTED

COMPONENT MOUNTING DEVICE

TECHNICAL FIELD

The present description discloses a component mounting device for picking up and mounting a component on a mounting target object.

BACKGROUND ART

Conventionally, as a component mounting device of this type, there has been proposed a component mounting device including a mounting head, a nozzle lifting and lowering device, air selector valves (selector valves), and a line sensor unit (for example, refer to Patent Literature 1). The mounting head has multiple suction nozzles arranged circumferentially. The nozzle lifting and lowering device is provided in the mounting head and lifts up and lowers a predetermined suction nozzle among the multiple suction nozzles. An air selector valve is provided for each suction nozzle and is made up of a solenoid valve configured to enable switching, independently for each suction nozzle, between drawing or blowing out air by energizing or deenergizing an electromagnet. The line sensor unit is configured as a detection device for detecting the presence or absence of a component and detecting a pickup orientation. In the component mounting device, when a suction operation of sucking an electronic component by the suction nozzle is finished, the line sensor unit determines whether the suction nozzle holds an electronic component, and when it determines that the suction nozzle holds no component, the line sensor unit causes the solenoid valve (the electromagnet) to cut off a flow path establishing communication between the suction nozzle and a vacuum source. In the component mounting device, the vacuum suction operation is stopped by cutting off the vacuum path from the vacuum source to prevent leakage of negative pressure.

PATENT LITERATURE

Patent Literature 1: JP-A-2007-36162

BRIEF SUMMARY

Patent Literature 1 described above describes a technique for preventing leakage of negative pressure when a component pickup error occurs in the component mounting device in which the electromagnets (the valve driving devices) are provided individually for the air selector valves (the selector valves) provided individually for the suction nozzles (holders). However, in Patent Literature 1, nothing is mentioned regarding the prevention of leakage of negative pressure when a suction error occurs in a component mounting device in which the selector valves and the valve driving devices are detached, and the valve driving device can drive the selector valve corresponding to the holder in the multiple holders individually holding the suction nozzles that stays in a predetermined revolving position where the holder can be lifted up and lowered. A main object of the present disclosure is to provide a component mounting device having a valve driving device configured to drive a selector valve corresponding to a holder, among multiple holders individually holding nozzles, located at a predetermined revolving position where the holder can be lifted up and lowered, thereby adequately preventing leakage of negative pressure when the nozzle held by the holder fails to pick up an electronic component by suction.

Solution to Problem

In order to achieve the main object described above, according to the present disclosure, the following measures are taken.

According to the present disclosure, there is provided a component mounting device configured to pick up a component by suction to mount the component on a target object, the component mounting device including: a negative pressure source configured to generate a negative pressure; a nozzle configured to pick up the component by suction at a suction port; a rotary head including a rotating body including multiple holders disposed in a circumferential direction, the holders each being configured to hold the nozzle and including a holder flow path formed in an interior space in such a manner as to communicate with the suction port of the nozzle; a rotating device configured to rotate the rotational body so as to revolve the multiple holders in the circumferential direction; multiple lifting and lowering devices configured to individually lift up and lower the holders, among the multiple holders, that are located in multiple predetermined revolving positions; multiple selector valves provided in such a manner as to individually correspond to the multiple holders to make and break communications between the holder flow paths of the corresponding holders and the negative pressure source; valve driving devices configured to drive the selector valves corresponding to the holders, among the multiple holders, that are located in the multiple predetermined revolving positions; and a control device configured to execute, when the component is requested to be picked up by suction, a suction operation in which the nozzle held by the holder located in either of the multiple predetermined revolving positions is caused to suck the component by causing the lifting and lowering device and the valve driving device that correspond to the holder in question to lower the holder in question and to bring a state of the selector valve corresponding to the holder in question into a state where the selector valve switches to make the holder flow path in the holder in question communicate with the negative pressure source, a suction error determination determining whether a suction error has occurred in which the nozzle held by the holder in question fails to pick up the component by suction after the suction operation is executed, and, when the control device determines that a suction error has occurred, a negative pressure recovery operation in which, when the holder holding the nozzle on which the suction error has occurred is revolved to either of the multiple revolving positions, the valve driving device corresponding to the selector valve that corresponds to the holder in question is caused to bring the selector valve in question into a state where the selector valve switches to breaking communication between the holder flow path in the holder in question and the negative pressure source.

A component mounting device of the present disclosure includes multiple selector valves provided in such a manner as to correspond individually to multiple holders configured to switch between making and breaking communication between a corresponding holder flow path and a negative pressure source, and valve driving devices configured to drive selector valves corresponding to holders, among the multiple holders, located in predetermined revolving positions. Then, the component mounting device can execute a negative pressure recovery operation when a suction error is determined to have occurred in which the component is not held by suction to the nozzle after the suction operation is executed. The component mounting device performs the negative pressure recovery operation by waiting for the holder in question to be rotated to a predetermined revolving position and drives the selector valve corresponding to the holder in question using the valve driving device to cut off communication between the holder flow path and the negative pressure source. As a result, the component mounting device, having a valve driving device configured to drive a selector valve corresponding to a holder, among multiple holders individually holding nozzles, located at a predetermined revolving position where the holder can be lifted up and lowered, is capable of adequately preventing leakage of negative pressure when the nozzle held by the holder fails to pick up an electronic component by suction.

BRIEF DESCRIPTION OF DRAWINGS

FIG. 8 is a diagram illustrating details of a suction operation, a component presence/absence determination, and a negative pressure recovery operation.

FIG. 9 is a diagram illustrating details of the suction operation, the component presence/absence determination, and the negative pressure recovery operation.

FIG. 10 is a diagram illustrating details of a pickup operation, a component presence/absence determination, and a negative pressure recovery operation according to another embodiment.

DETAILED DESCRIPTION

Figure 1:
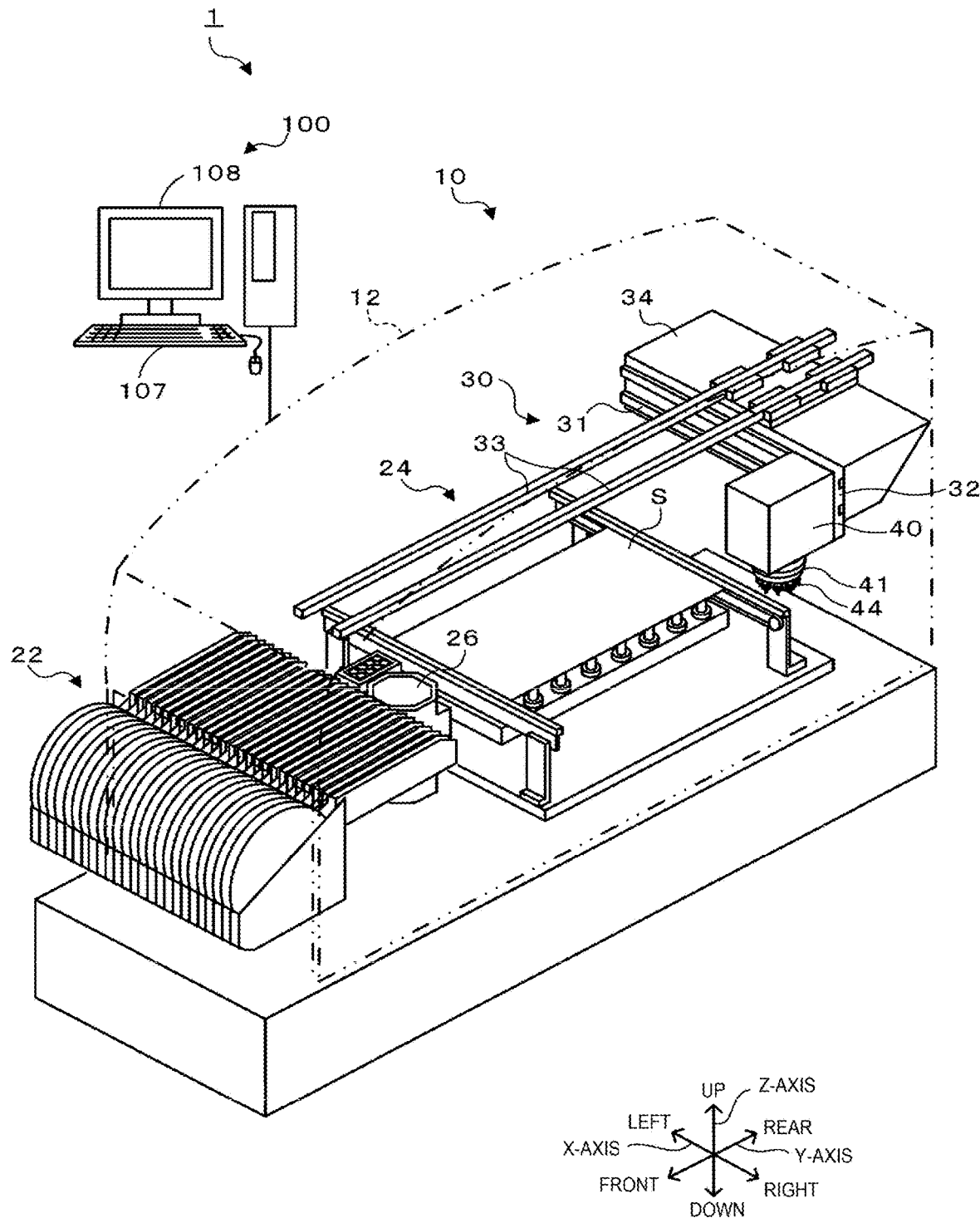
FIG. 1 is a diagram showing a schematic configuration of component mounting system 1.

Next, referring to the drawings, embodiments of the present disclosure will be described.

Figure 2:
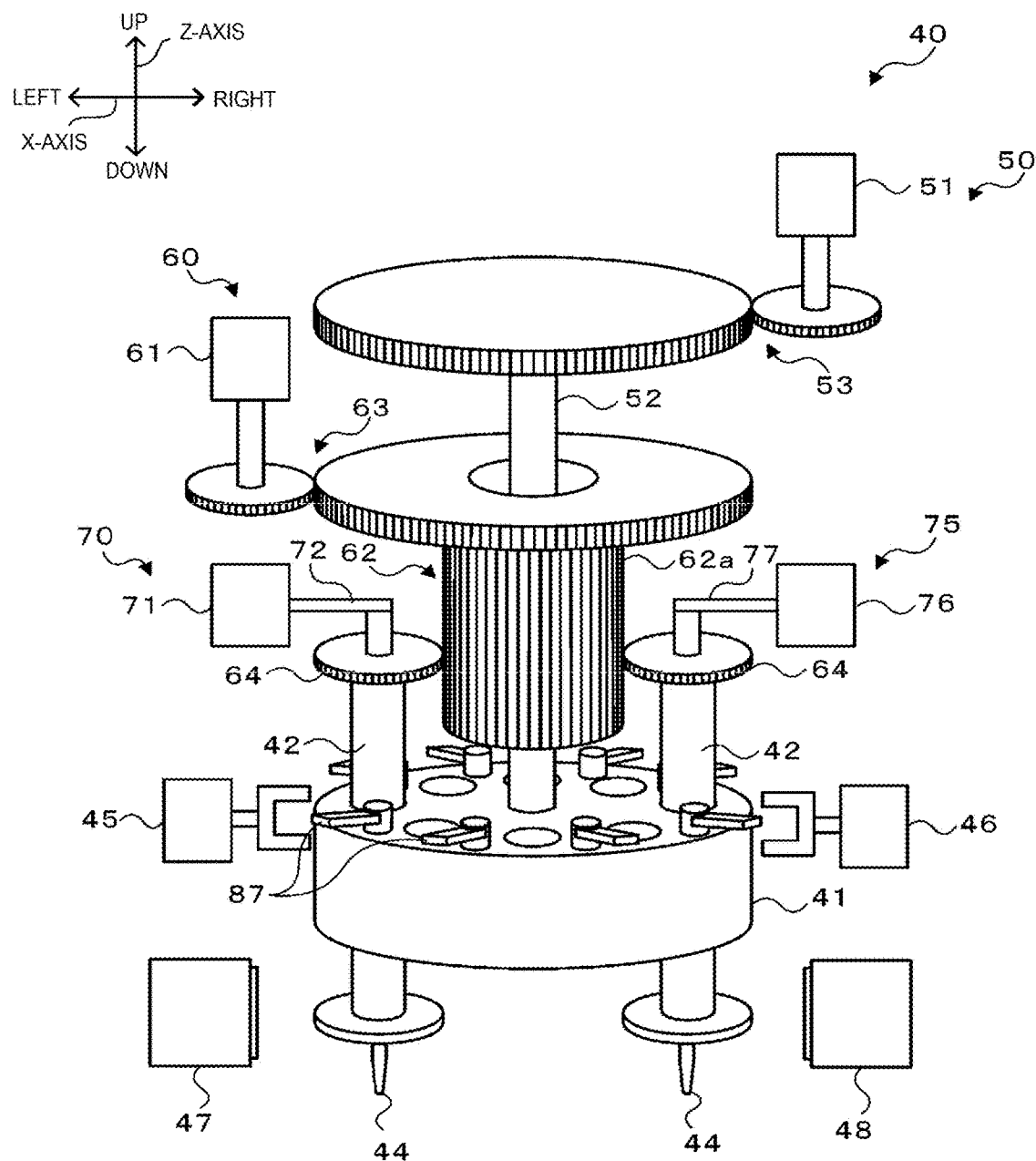
FIG. 2 is a diagram showing a schematic configuration of mounting head 40.
Figure 3:
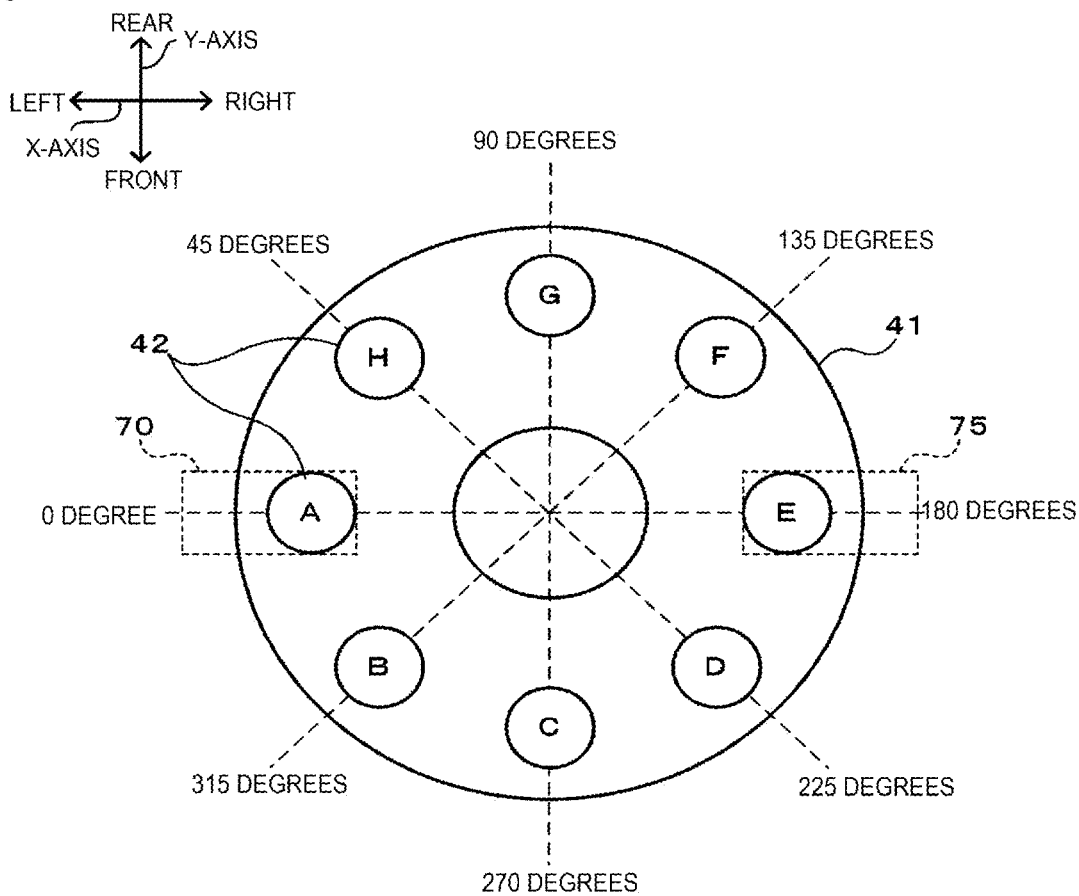
FIG. 3 is a diagram illustrating an arrangement of nozzle holders 42 and a disposition of first Z-axis driving device 70 and second Z-axis driving device 75.
Figure 4:
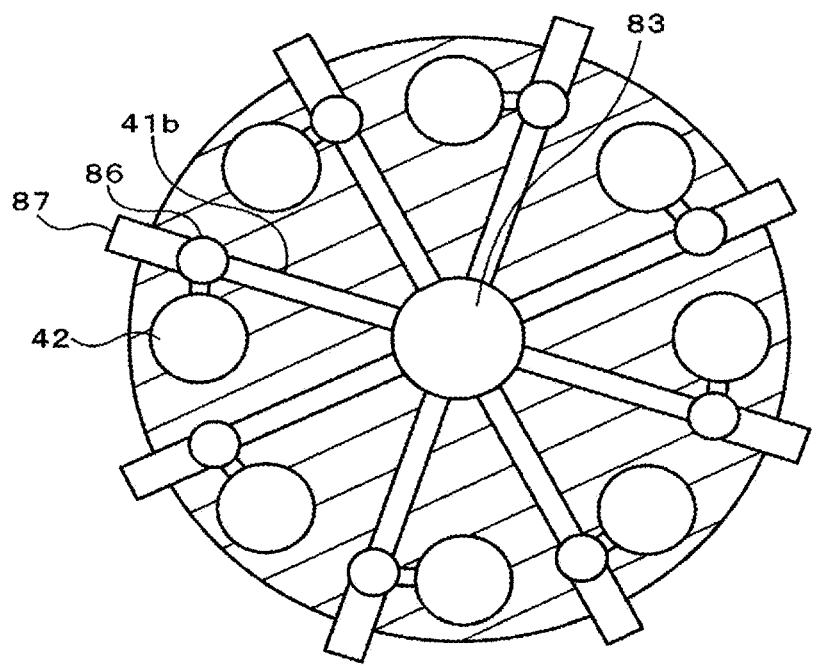
FIG. 4 is a diagram illustrating piping paths.
Figure 5:
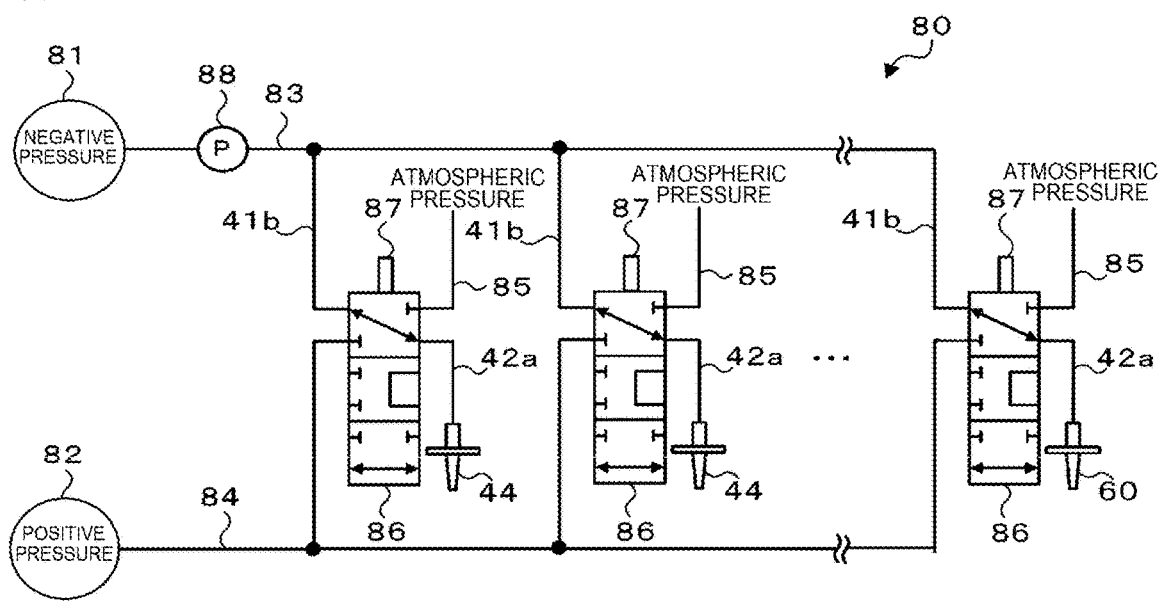
FIG. 5 is a diagram showing a schematic configuration of pressure supply device 80.
Figure 6:
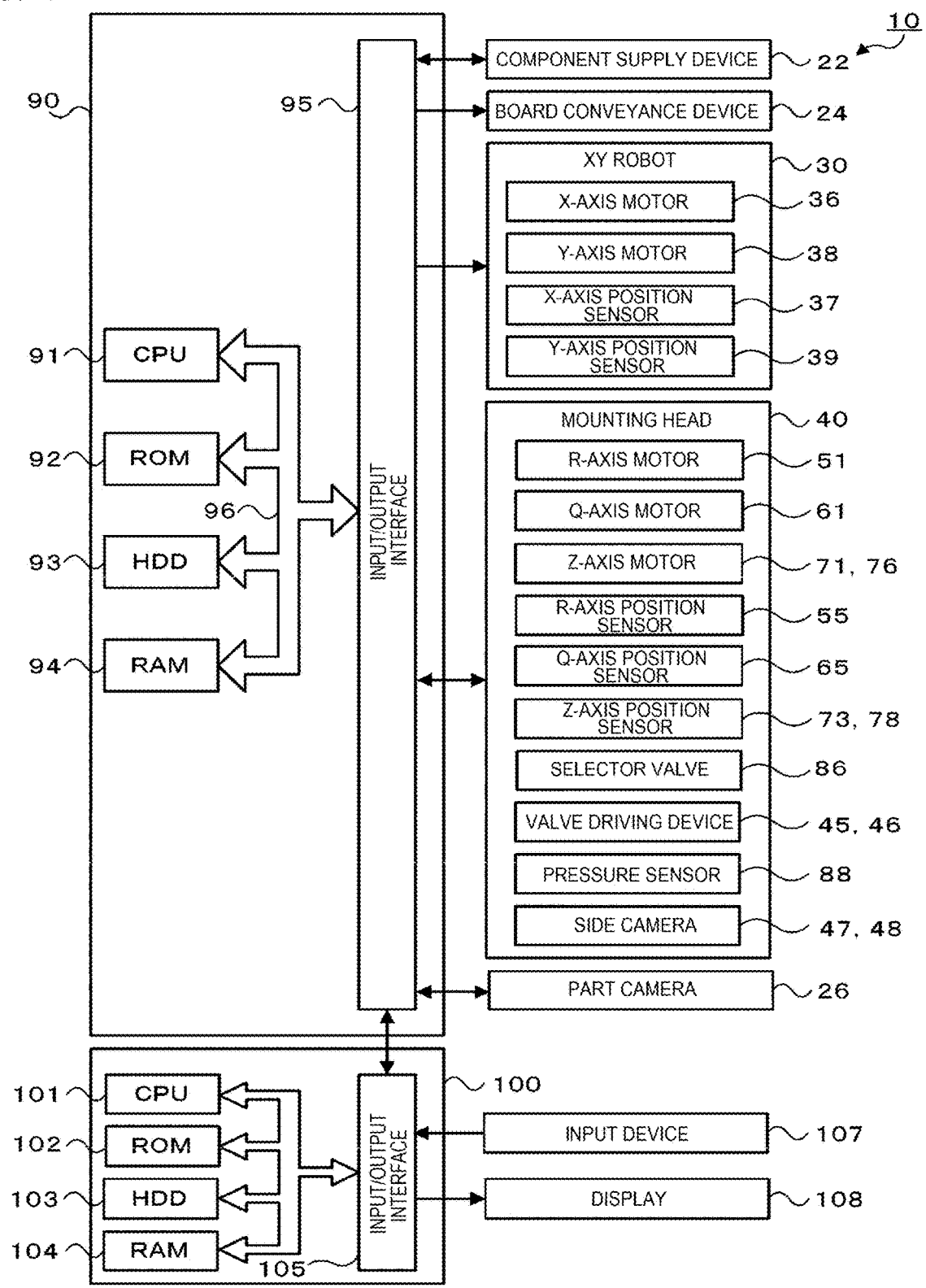
FIG. 6 is a diagram illustrating electrical connections between control device 90 and management device 100.

FIG. 1 is a diagram showing a schematic configuration of component mounting system 1. FIG. 2 is a diagram showing a schematic configuration of mounting head 40. FIG. 3 is a diagram illustrating an arrangement of nozzle holders 42 and a disposition of first Z-axis driving device 70 and second Z-axis driving device 75. FIG. 4 is a diagram illustrating piping paths. FIG. 5 is a diagram showing a schematic configuration of pressure supply device 80. FIG. 6 is a diagram illustrating electrical connections between control device 90 and management device 100. In FIG. 1, the left-right direction denotes the X-axis direction, the front (the near side)-rear (the far side) direction denotes the Y-axis direction, and the up-down direction denotes the Z-axis direction.

As shown in FIG. 1, component mounting system 1 includes component mounting device 10 which is one of multiple component mounting devices 10 that are arranged side by side in a direction in which boards S are conveyed to make up a component mounting line and management device 100 configured to control the whole system.

As shown in FIG. 1, component mounting device 10 includes housing 12, component supply devices 22, board conveyance device 24, XY robot 30, mounting head 40, and control device 90 (refer to FIG. 6). In addition, component mounting device 10 includes part camera 26, a mark camera (not shown), and the like. Part camera 26 captures an image of a orientation of component P suction held by suction to mounting head 40 from below. The mark camera is provided in mounting head 40 configured to capture an image of a positioning reference mark attached to board S from above and read the positioning reference mark.

Component supply devices 22 are each configured as a tape feeder for supplying component P to a component supply position by drawing a tape on which components P are installed at predetermined intervals from a reel and pitch feeding the tape so drawn. These multiple component supply devices 22 are provided in a manner so as to be aligned side by side in a left-right direction (the X-axis direction) at the front of component mounting device 10.

Board conveyance device 24 includes a pair of conveyor belts provided in such a manner as to be spaced away from each other in the front-rear direction while extending in the left-right direction. Board S is conveyed from left to right in FIG. 1 by the conveyor belts of board conveyance device 24.

XY robot 30 moves mounting head 40 in X- and Y-axis directions and includes X-axis slider 32 and Y-axis slider 34, as shown in FIG. 1. X-axis slider 32 is supported by X-axis guide rail 31 provided on a front surface of Y-axis slider 34 in such a manner as to extend in the X-axis direction and can move in the X-axis direction by being driven by X-axis motor 36 (refer to FIG. 6). Y-axis slider 34 is supported by a pair of left and right Y-axis guide rails 33 provided at an upper stage portion of housing 12 in such a manner as to extend in the Y-axis direction and can move in the Y-axis direction by being driven by Y-axis motor 38 (refer to FIG. 6). The position of X-axis slider 32 in the X-axis direction is detected by X-axis position sensor 37 (refer to FIG. 6), and the position of Y-axis slider 34 in the Y-axis direction is detected by Y-axis position sensor 39 (refer to FIG. 6). Mounting head 40 is attached to X-axis slider 32. As a result, mounting head 40 can move to any position on the XY-plane by controlling the driving of XY robot 30 (X-axis motor 36 and Y-axis motor 38).

As shown in FIG. 2, mounting head 40 includes head main body 41, nozzle holders 42, suction nozzles 44, R-axis driving device 50, Q-axis driving device 60, first Z-axis driving device 70, second Z-axis driving device 75, and side cameras 47, 48.

Head main body 41 is a rotating body that can be rotated by R-axis driving device 50. Nozzle holders 42 are provided in head main body 41 in such a manner as to be arranged at predetermined angular intervals in a circumferential direction and are supported in such a manner as to be freely lifted up and lowered through head main body 41. Suction nozzles 44 can detachably attached to distal end portions of nozzle holders 42.

R-axis driving device 50 rotates (revolves) multiple nozzle holders 42 (multiple suction nozzles 44) in the circumferential direction around a center axis of head main body 41. As shown in FIG. 2, R-axis driving device 50 includes R-axis motor 51, R shaft 52 extending in an axial direction from the center axis of head main body 41, and transmission gear 53 that transmits the rotation of R-axis motor 51 to R shaft 52. R-axis driving device 50 further includes R shaft position sensor 55 (refer to FIG. 6) configured to detect the rotational position of R-axis motor 51. R-axis driving device 50 rotates head main body 41 by rotating R-shaft 52 via transmission gears 53 with R-axis motor 51. Each nozzle holder rotates (revolves) in the circumferential direction together with corresponding suction nozzle 44 as a result of the rotation of head main body 41.

Q-axis driving device 60 rotates each nozzle holder 42 (each suction nozzle 44) around its own center axis. As shown in FIG. 2, Q-axis driving device 60 includes Q-axis motor 61, cylindrical member 62, transmission gear 63, and Q-axis gears 64. Cylindrical member 62 is placed over R shaft 52 concentrically with and rotatably relative to R shaft 52 and includes a flat-toothed gear 62a formed on the outer circumferential surface thereof. Transmission gear 63 transmits the rotation of Q-axis motor 61 to cylindrical member 62. Q-axis gears 64 are provided at upper portions of individual nozzle holders 42 and engage with gear 62a of cylindrical member 62 while sliding in the Z-axis direction (the up-down direction). Additionally, Q-axis driving device 60 includes Q-axis position sensor 65 (refer to FIG. 6) configured to detect the rotational position of Q-axis motor 61. Q-axis driving device 60 rotationally drives cylindrical member 62 via transmission gear 63 using Q-axis motor 61, whereby Q-axis gears 64 engaging with gear 62a of cylindrical member 62 can be rotated together. Each nozzle holder 42 rotates about its own center axis together with corresponding suction nozzle 44 as a result of the rotation of Q-axis gear 64.

First and second Z-axis driving devices 70, 75 are configured to individually lift up and lower corresponding nozzle holders 42 at two locations on a rotating (revolving) track of nozzle holders 42. In the present embodiment, as shown in FIG. 3, first Z-axis driving device 70 is capable of lifting up and lower nozzle holder 42, among nozzle holders 42 supported by head main body 41, located at a 0 degree angle position (hereinafter, also, referred to as "Z1"). Second Z-axis driving device 75 is capable of lifting up and lowering nozzle holder 42, among the nozzle holders 42 supported on head main body 41, located at a 180 degree angle position (hereinafter, also, referred to as Z2). The 0 degree angle position denotes a position upstream in the board conveyance direction (the X-axis direction) with respect to the center axis of head main body 41 (A in FIG. 3), and the 180 degree angle position denotes a position downstream in the board conveyance direction (E in FIG. 3).

As shown in FIG. 2, first and second Z-axis driving devices 70, 75 include Z-axis sliders 72, 77 and Z-axis motors 71, 76 configured to lift up and lower Z-axis sliders 72, 77, respectively. In addition, first and second Z-axis driving devices 70, 75 also include Z-axis position sensors 73, 78 (refer to FIG. 6) configured to detect lifted up and lowered positions of Z-axis sliders 72, 77, respectively. First and second Z-axis driving devices 70, 75 drive the Z-axis motors 71, 76, respectively, to lift up and lower Z-axis sliders 72, 77 so as to bring them into abutment with nozzle holders 42 lying below Z-axis sliders 72, 77, whereby nozzle holders 42 are caused to be lifted up and lowered together with corresponding suction nozzles 44. First and second Z-axis driving devices 70, 75 may use linear motors as Z-axis motors 71, 76 to lift up and lower Z-axis sliders 72, 77, or may use rotary motors and feed screw mechanisms to lift up and lower Z-axis sliders 72, 77. In addition, first and second Z-axis driving devices 70, 75 may be configured to lift up and lower Z-axis sliders 72, 77 by using actuators such as an air cylinder instead of Z-axis motors 71, 76. As described above, mounting head 40 of the present embodiment includes two Z-axis driving devices 70, 75 individually configured to lift up and lower nozzle holders 42 (suction nozzles 44), respectively, and can individually perform a suction operation of component P by use of suction nozzle 44 using Z-axis driving devices 70, 75. As a result, mounting head 40 can supply two components P from component supply devices 22 at the same arrangement interval as that of two suction nozzles 44 which can be lifted up and lowered by two Z-axis driving devices 70, 75, thereby making it possible for two components S to be sucked by two suction nozzles 44 at approximately the same time by lowering two suction nozzles 44 at approximately the same time.

Suction nozzle 44 can suck component P and mount sucked component P on board S by means of pressure (a negative pressure, a positive pressure) supplied from pressure supply device 80. As shown in FIG. 5, pressure supply device 80 includes negative pressure source (negative pressure pump) 81, positive pressure source (positive pressure pump) 82, and selector valve 86 configured to select a pressure to be supplied to a suction port of corresponding suction nozzle 44 from a negative pressure, a positive pressure, and atmospheric pressure. Selector valve 86 is a four-port three-position valve to which negative pressure flow path 83 communicating with negative pressure source 81, positive pressure flow path 84 communicating with positive pressure source 82, atmospheric pressure flow path 85 communicating with the atmosphere, and holder flow path 42a in an interior of nozzle holder 42 that communicates with the suction port of suction nozzle 44 are connected. Selector valve 86 can be switched to or select, as the three positions, a position where holder flow path 42a communicates with negative pressure flow path 83 and is cut off from the other flow paths (i.e., a negative pressure supply position), a position where holder flow path 42a communicates with atmospheric pressure flow path 85 and is cut off from the other flow paths (a atmospheric pressure supply position), and a position where the holder flow path 42a communicates with positive pressure flow path 84 and is cut off from the other flow paths (a positive pressure supply position). As shown in FIG. 4, selector valve 86 is provided in such a manner as to match with each nozzle holder 42 (holder flow path 42a), is connected to negative pressure flow path 83 via radial passage 41a that extends radially from an axial center of head main body 41, and is connected to positive pressure flow path 84 via a similar radial flow path (not shown). Additionally, pressure sensor 88, configured to detect a pressure (a negative pressure) inside the flow path, is provided in negative pressure flow path 83.

Selector valve 86 does not have an automatic return function and is configured to select the negative pressure supply position, the atmospheric pressure supply position, and the positive pressure supply position by valve operation lever 87 being operated. As shown in FIG. 2, valve operation lever 87 is operated by either of two valve driving devices 45, 46. Valve driving device 45 can drive valve operation lever 87 of selector valve 86 corresponding to nozzle holder 42 located in the position where nozzle holder 42 can be lifted up and lowered by first Z-axis driving device 70. On the other hand, valve driving 46 can drive valve operation lever 87 of selector valve 86 corresponding to nozzle holder 42 located in the position where nozzle holder 42 can be lifted up and lowered by second Z-axis driving device 75. Valve driving devices 45, 46 can be made up, for example, of a motor and a conversion mechanism (a cam mechanism, a link mechanism, or the like) for converting a rotational motion of the motor into a stroke motion.

Side cameras 47, 48 each capture an image of the vicinity of the distal end of corresponding suction nozzle 44 from a side thereof in order to determine whether suction nozzle 44 sucks successfully or fails to suck a component or an orientation of a component held by suction nozzle 44 after suction nozzle 44 executes a suction operation. In the present embodiment, side camera 47 can image suction nozzle 44 when suction nozzle 44 is rotated one pitch ahead by R-axis driving device 50 after suction nozzle 44 is lowered by first Z-axis driving device 70 to execute the suction operation. Side camera 48 can image suction nozzle 44 when suction nozzle 44 is rotated one pitch ahead by R-axis driving device 50 after suction nozzle 44 is lowered by second Z-axis driving device 75 to execute the suction operation.

As shown in FIG. 6, control device 90 is configured as a microprocessor made up mainly of CPU 91 and includes ROM 92, HDD 93, RAM 94, input/output interface 95, and the like in addition to CPU 91. These constituent elements are connected together via bus 96. Various detection signals are inputted into control device 90 from X-axis position sensor 37, Y-axis position sensor 39, R-axis position sensor 55, Q-axis position sensor 65, Z-axis position sensors 73, 78, and the like. Image signals and the like are also inputted into control device 90 via input/output interface 95 from part camera 26 and side cameras 47, 48. On the other hand, control device 90 outputs various control signals to component supply devices 22, board conveyance device 24, X-axis motor 36, Y-axis motor 38, R-axis motor 51, Q-axis motor 61, Z-axis motors 71, 76, valve driving devices 45, 46, side cameras 47, 48, and the like.

Management device 100 is, for example, a general-purpose computer and includes CPU 101, ROM 102, HDD 103, RAM 104, input/output interface 105, and the like, as shown in FIG. 6. An input signal from input device 107 is input into management device 100 via input/output interface 105. A display signal to display 108 is outputted from management device 100 via input/output interface 105. HDD 103 stores job information including production programs of boards S and other production information. Here, the production program denotes a program that determines which component P is mounted on which board S in which order and the number of boards to be produced in such a manner in component mounting device 10. In addition, the production information includes component information (types of components and supply positions thereof) relating to components P to be mounted, nozzle information relating to suction nozzles 44 to be used, mounting positions (XY coordinates) of components P on board S, and the like. Management device 100 is communicably connected with control device 90 of component mounting device 10 and exchanges various information and control signals with control device 90.

When management device 100 receives the job information, the component mounting device 10 of the present embodiment that is configured as described above executes the suction operation and the mounting operation as one cycle. The suction operation is an operation in which mounting head 40 is moved to a position above component supply device 22, nozzle holder 42 (suction nozzle 44) is lowered by either of Z-axis driving devices 70, 75 while being rotated to bring component P into abutment with suction nozzle 44, and a negative pressure is supplied to suction nozzle 44 so as to suck component P to be held by suction to suction nozzle 44. The mounting operation is an operation in which mounting head 40 is moved to a position above board S, nozzle holder 42 (suction nozzle 44) is lowered by either of Z-axis driving devices 70, 75 while being rotated to bring component P held by suction to suction nozzle 44 into abutment with a target position on board S, and a positive pressure is supplied to suction nozzle 44 so as to mount component P on board S.

Figure 7:
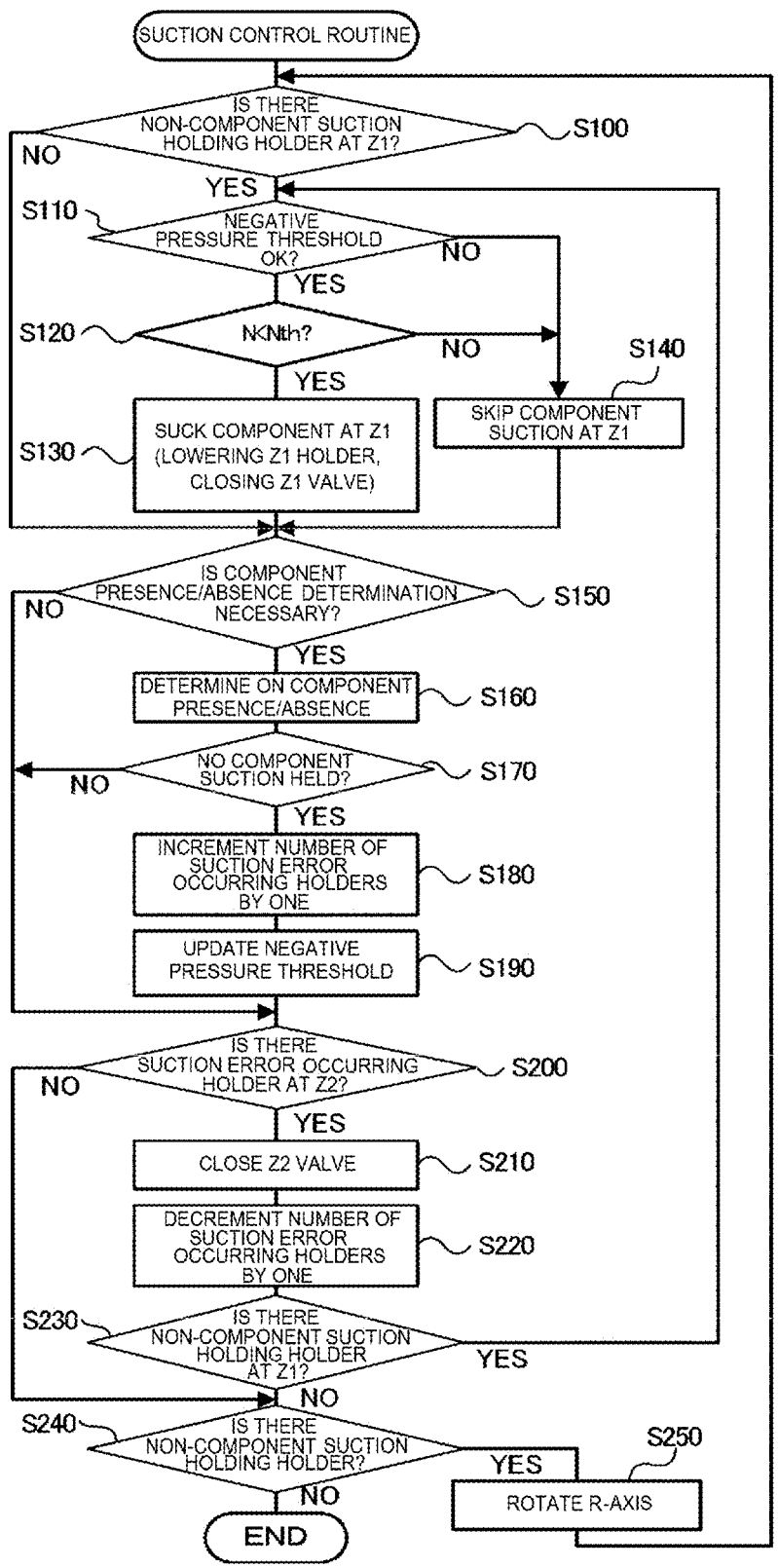
FIG. 7 is a flow chart illustrating an example of a pickup control routine.

FIG. 7 is a flow chart showing an example of a suction control routine executed by CPU 91 of control device 90. This processing is assumed for the suction operation to be executed at Z1. When the suction control routine is executed, CPU 91 of control device 90 first determines whether component P is not held by suction nozzle 44 held by nozzle holder 42 located at Z1 (S100). If CPU 91 determines that holding of no component by suction nozzle 44 is not occurring at Z1, that is, component P has already been sucked and held by suction nozzle 44 at Z1, the suction control routine proceeds to the process in S150. On the other hand, if CPU 91 determines that no component has been sucked and held to suction nozzle 44 at Z1, CPU 91 determines both whether an absolute value of a negative pressure in negative pressure flow path 83 from pressure sensor 88 is equal to a negative pressure threshold or greater (negative pressure threshold OK) (S110) and whether the number N of suction error occurring holders is smaller than a permissible maximum Nth (S120). The number N of suction error occurring holders denotes the number of holders, among nozzle holders 42 (suction nozzles 44) that have executed the suction operation but are determined to hold no component by a component presence/absence determination, which will be described later, and whose holder flow paths 42a are caused to communicate with negative pressure flow path 83 (negative pressure source 81) by selector valve 86. If CPU 91 determines that the absolute value of the negative pressure is equal to the negative pressure threshold or greater and that the number N of suction error occurring holders is less than the permissible maximum number Nth, CPU 91 executes the suction operation in which nozzle holder 42 located at Z1 is lowered and negative pressure is supplied to the suction port of suction nozzle 44 held by nozzle holder 42 in question (S130). Specifically, the suction operation is executed by controlling the driving of Z-axis motor 71 of first Z-axis driving device 70 so as to lower nozzle holder 42 located at Z1 (lowering Z1 holder), and controlling the driving of valve driving device 45 so as to make holder flow path 42a in nozzle holder 42 in question communicate with negative pressure flow path 83 (opening Z1 valve). On the other hand, if CPU 91 determines that the absolute value of the negative pressure is less than the negative pressure threshold and determines that the number N of suction error occurring holders is equal to the permissible maximum number Nth or greater, CPU 91 skips a component P suction operation at Z1 (S140).

Next, CPU 91 determines whether it is necessary to execute a component presence/absence determination (a suction error determination) (S150). This determination is made by determining whether nozzle holder 42 (suction nozzle 44) that has executed the suction operation at Z1 has been moved (revolved) to an imaging area of side camera 47. If CPU 91 determines that it is unnecessary to execute a component presence/absence determination, CPU 91 proceeds to the process in S200, whereas CPU 91 determines that it is necessary to execute a component presence/absence determination, CPU 91 executes the component presence/absence determination (S160). The component presence/absence determination is executed by capturing an image of suction nozzle 44 that has executed the suction operation at Z1 using side camera 47, processing the captured image, and determining whether component P can be recognized in the image. As described above, holder flow path 42a of each nozzle holder 42 is connected to common negative pressure flow path 83 (negative pressure source 81) via corresponding selector valve 86. As a result, in the event that component P is not held by suction to suction nozzle 44 held by nozzle holder 42 with selector valve 86 being selected to make holder flow path 42a communicate with negative pressure flow path 83, leakage of negative pressure occurs in negative pressure flow path 83. If CPU 91 determines that a component is held by suction to suction nozzle 44 in question as a result of the component presence/absence determination ("NO" in S170), CPU 91 proceeds to the process in S200. On the other hand, if CPU 91 determines that no component is held by suction to suction nozzle 44 in question, that is, that a suction error has occurred ("YES" in S170), CPU 91 increments the value of the number N of suction error occurring holders by one (S180) and updates the negative pressure threshold determination (S190). Here, the process in S190 is a process for suppressing the occurrence of a suction error from S190 on, and for example, as the number of times of occurrence of sucking error increases, the negative pressure threshold is increased so as to make it easier to determine that the absolute value of the negative pressure in negative pressure flow path 83 is lower than the negative pressure threshold.

Next, CPU 91 determines whether there is a suction error occurring holder at Z2 (S200). If CPU 91 determines that there is no suction error occurring holder at Z2, CPU 91 proceeds to the process in S240. On the other hand, if CPU 91 determines that there is a suction error occurring holder at Z2, CPU 91 executes a negative pressure recovery operation in which valve driving device 46 is caused to drive corresponding selector valve 86 so as to select cutting off holder flow path 42a in the holder in question from negative pressure flow path 83 (negative pressure source 81) (a closure of the Z2 valve) (S210). That is, CPU 91 executes the suction operation by causing valve driving device 45 corresponding to Z1 to cause the suction port of suction nozzle 44 located at Z1 to communicate with negative pressure flow path 83, whereas when a suction error occurs, CPU 91 waits for suction nozzle 44 in question to move to Z2 and then causes valve driving device 46 corresponding to Z2 to cut off the suction port of suction nozzle 44 in question from negative pressure flow path 83. As a result, component mounting device 10 shortens the period of time in which leakage occurs as much as possible to suppress the decrease in the negative pressure in negative pressure flow path 83. Then, CPU 91 decrements the value of the number of suction error occurring holders by one (S220) and determines whether a non-component suction holding holder exists at Z1 (S230). If CPU 91 determines that a non-component suction holding holder does not exist at Z1, CPU 91 proceeds to S240, whereas if CPU 91 determines that a non-component suction holding holder exists at Z1, CPU 91 returns to S110. That is, when the negative pressure (the absolute value) in negative pressure flow path 83 is recovered to the negative pressure threshold or greater as a result of the negative pressure recovery operation executed at Z2, CPU 91 executes the suction operation by using nozzle holder 42 (suction nozzle 44) located at Z1. As a result, component mounting device 10 can efficiently execute the suction operation and the negative pressure recovery operation to improve productivity. The negative pressure recovery operation may be performed only when the absolute value of the negative pressure in negative pressure flow path 83 is less than the negative pressure threshold (negative pressure threshold NG). In this instance, a determination of whether the absolute value of the negative pressure in negative pressure flow path 83 is less than the negative pressure threshold need only be added before or after S200. In this instance, although there is a possibility that a suction error occurring holder passes through Z2 without the negative pressure recovery operation being executed thereon, CPU 91 may execute the negative pressure recovery operation when the suction error occurring holder arrives at either of Z1 and Z2 with the absolute value of the negative pressure becoming less than the negative pressure threshold. With the absolute value of the negative pressure remaining at the negative pressure threshold or greater, CPU 91 may execute the suction operation again using the suction error occurring holder with holder flow path 42a in the holder in question being kept in communication with negative pressure flow path 83.

Then, CPU 91 determines whether a non-component suction holding holder (suction nozzle) exists that does not hold component P by suction in nozzle holders 42 (suction nozzles 44) (S240). If CPU 91 determines that a non-component suction holding holder exists, CPU 91 drives R-axis driving device 50 (R-axis motor 51) so that the next nozzle holder 42 arrives at Z1 (the position where nozzle holder 42 can be lifted up and lowered by first Z-axis driving device 70) (S250) and then returns to S100.

FIGS. 8 and 9 are diagrams illustrating details of the suction operation, the component presence/absence determination, and the negative pressure recovery operation. In the figures, reference signs A to H are identification symbols for identifying nozzle holders 42 and denote holders A to H, respectively. In the example shown in the figures, the permissible maximum number Nth of the number N of suction error occurring holders is set at three. Firstly, component mounting device 10 executes the suction operation by lowering the Z1 holder and opening the Z1 valve using holder A at Z1 (an operation of driving corresponding selector valve 86 by valve driving device 45 located at Z1 to make holder flow path 42a in nozzle holder 42 communicate with negative pressure flow path 83) (refer to FIG. 8(A)). Next, component mounting device 10 revolves each holder one pitch ahead, executes the suction operation by lowering the Z1 holder and opening the Z1 valve using holder B arriving at Z1, and determines whether a component is present at holder A using side camera 47 (refer to FIG. 8(B)). Here, component mounting device 10 determines that there is no component P held by holder A (a suction error has occurred) and determines that the negative pressure is equal to the negative pressure threshold or greater (negative pressure threshold OK). Subsequently, component mounting device 10 revolves each holder one pitch ahead, executes the suction operation by lowering the Z1 holder and opening the Z1 valve using holder C arriving at Z1, and determines whether a component is present at holder B (refer to FIG. 8(C)). Here, component mounting device 10 determines that there is no component P held by holder B and determines that the negative pressure is less than the negative pressure threshold (negative pressure threshold NG). Then, component mounting device 10 revolves each holder one pitch ahead, skips the suction operation using holder D arriving at Z1 since the negative pressure is less than the negative pressure threshold (negative pressure threshold NG), and determines whether a component is present at holder C (refer to FIG. 8(D)). Here, component mounting device 10 determines that component P is held by holder C. Next, since holder A on which the suction error has occurred arrives at Z2 when component mounting device 10 revolves each holder one pitch ahead, component mounting device 10 executes the negative pressure recovery operation by closing the Z2 valve (an operation of driving selector valve 86 by valve driving device 46 located at Z2 to cut off the communication between holder flow path 42*a* in nozzle holder 42 and negative pressure flow path 83). Subsequently, when the negative pressure is recovered, component mounting device 10 executes the suction operation using holder E arriving at Z1 (see FIG. 8(E)). Then, since holder B arrives at Z2 when component mounting device 10 revolves each holder one pitch ahead, component mounting device 10 executes the negative pressure recovery operation by closing the Z2 valve, executes the suction operation by lowering the Z1 holder and opening the Z1 valve using holder F arriving at Z1, and determines whether a component is present at holder E (refer to FIG. 8(F)).

Here, component mounting device 10 determines that there is no component P held by holder E and determines that the negative pressure is equal to the negative pressure threshold or greater (negative pressure threshold OK). Subsequently, component mounting device 10 revolves each holder one pitch ahead, executes the suction operation by lowering the Z1 holder and opening the Z1 valve using the holder G arriving at Z1, and determines whether a component is present at holder F (refer to FIG. 8(G)). Here, component mounting device 10 determines that component P is held by holder F. Then, component mounting device 10 revolves each holder one pitch ahead, executes the suction operation by lowering the Z1 holder and opening the Z1 valve using the holder H arriving at Z1, and determines whether a component is present at holder G (refer to FIG. 8(H)). Here, component mounting device 10 determines that there is no component P held to holder G and determines that the negative pressure is less than the negative pressure threshold (negative pressure threshold NG). Next, component mounting device 10 revolves each holder one pitch ahead, and then, since holder E on which the suction error has occurred arrives at Z2, component mounting device 10 executes the negative pressure recovery operation by closing the Z2 valve and determines whether a component is present at holder H. Here, component mounting device 10 determines that component P is held by holder H. Subsequently, when the negative pressure is recovered, component mounting device 10 executes the suction operation (re-suction) by lowering the Z1 holder and opening the Z1 valve using holder A arriving at Z1 (refer to FIG. 8(I)). Then, component mounting device 10 revolves each holder one pitch ahead, executes the suction operation by lowering the Z1 holder and closing the Z1 valve using holder B arriving at Z1, and determines whether a component is present at holder A (refer to FIG. 8(J)). Here, component mounting device 10 determines that component P is held by holder A. Next, component mounting device 10 revolves each holder one pitch ahead, and then, since holder G on which the suction error has occurred arrives at Z2, component mounting device 10 executes the negative pressure recovery operation by closing the Z2 valve and determines whether a component is present at holder B (refer to FIG. 8(K)). Here, component mounting device 10 determines that component P is held by holder B. Subsequently, component mounting device 10 revolves each holder one pitch ahead and executes the suction operation by lowering the Z1 holder and closing the Z1 valve using holder D (refer to FIG. 8(L)). Then, component mounting device 10 revolves each holder one pitch ahead, executes the suction operation by lowering the Z1 holder and closing the Z1 valve using holder E, and determines whether a component is present at holder D (refer to FIG. 8(M)). Here, component mounting device 10 determines that component P is held by holder D. Next, component mounting device 10 revolves each holder one pitch ahead, and determines whether a component is present at holder E (refer to FIG. 8(N)). Here, component mounting device 10 determines that component P is held by holder E. Subsequently, component mounting device 10 revolves each holder one pitch ahead and executes the suction operation by lowering the Z1 holder and closing the Z1 valve using holder G arriving at Z1 (refer to FIG. 8(O)). Then, component mounting device 10 revolves each holder one pitch ahead and determines whether a component is present at holder G (refer to FIG. 8(P)). Here, component mounting device 10 determines that component P is held by holder G. In this way, component mounting device 10 causes components P to be held by suction to all nozzle holders 42 (suction nozzles 44).

Here, the correspondence between the constituent elements of the present embodiment and constituent elements of the disclosure of the present disclosure will be clarified. Negative pressure source 81 of the present embodiment corresponds to a "negative pressure source" of the present disclosure, suction nozzle 44 corresponds to a "nozzle", head main body 41 corresponds to a "rotating body", mounting head 40 corresponds to a "rotary head", R-axis driving device 50 corresponds to a "rotating device", first and second Z-axis driving devices 70, 75 correspond to a "lifting and lowering device", selector valve 86 corresponds to a "selector valve", valve driving devices 45, 46 correspond to a "valve driving device", and control device 90 corresponds to a "control device". In addition, first Z-axis driving device 70 corresponds to a "first lifting and lowering device", second Z-axis driving device 75 corresponds to a "second lifting and lowering device", valve driving device 45 corresponds to a "first valve driving device", and valve driving device 46 corresponds to a "second valve driving device".

Component mounting device 10 of the present embodiment that has been described heretofore includes selector valves 86 individually provided in such a manner as to correspond to multiple nozzle holders 42 each holding suction nozzle 44 and capable of selecting making and interrupting a supply of negative pressure and valve driving devices 45, 46 configured to drive corresponding selector valves 86 in the positions (Z1, Z2) where nozzle holders 42 in multiple nozzle holders 42 can be lifted up and lowered. In addition, component mounting device 10 executes the suction operation by supplying negative pressure to nozzle holder 42 (suction nozzle 44) located at Z1 by driving corresponding selector valve 86 by corresponding valve driving device 45 and then determines whether a suction error has occurred at suction nozzle 44. Then, when determining that a suction error has occurred, component mounting device 10 executes the negative pressure recovery operation by cutting off the supply of negative pressure to nozzle holder 42 (suction nozzle 44) where the suction error has occurred by driving corresponding selector valve 86 with valve driving device 45 when nozzle holder 42 holding suction nozzle 44 where the suction error has occurred moves to Z2. As a result, component mounting device 10 can adequately prevent the negative pressure from leaking when a suction error occurs at suction nozzle 44 held by nozzle holder 42.

Further, in component mounting device 10 of the present embodiment, when the absolute value of the negative pressure in negative pressure flow path 83 is less than the negative pressure threshold, the execution of the suction operation is stopped, and when the negative pressure in negative pressure flow path 83 is recovered by the negative pressure recovery operation, the suction operation is resumed, whereby the suction operation can efficiently be executed.

Further, in component mounting device 10 of the present embodiment, since the suction operation is executed in such a manner that the number N of suction error occurring holders does not exceed the permissible maximum number Nth, a reduction in negative pressure in negative pressure flow path 83 can be suppressed efficiently.

The present disclosure is not limited in any way to the embodiment that has been described heretofore, and hence, needless to say, the present disclosure can be carried out in various forms without departing from the technical scope of the present disclosure.

For example, in the embodiment described above, component mounting device 10 is described as sucking component P using either of first and second Z-axis driving devices 70, 75; however, component mounting device 10 may suck two components P at approximately the same time using both first and second Z-axis driving devices 70, 75. In this instance, in S100 of the suction control routine shown in FIG. 7, CPU 91 determines whether a non-component suction holding holder also exists at Z2 in addition to at Z1. Then, as the suction operation in S130, when the non-component suction holding holders both exist at Z1 and Z2, CPU 91 executes the suction operations at approximately the same time using both non-component suction holding holders, whereas when a non-component suction holding holder exists at only one of Z1 and Z2, CPU 91 executes the suction operation using only the non-component suction holding holder. In addition, in S200 of the same routine, CPU 91 determines whether a suction error occurring holder also exists at Z1 in addition to Z2. Then, as the negative pressure recovery operation in S210, when suction error occurring holder 42 is located at Z1, CPU 91 drives corresponding selector valve 86 by corresponding valve driving device 45 (Z1 valve closed), whereas when suction error occurring holder 42 is located at Z2, CPU 91 drives corresponding selector valve 86 by corresponding valve driving device 46 (Z2 valve closed).

FIG. 10 is a diagram showing details of a suction operation, a component presence/absence determination, and a negative pressure recovery operation according to another embodiment. In the example shown in the figure, a permissible maximum number Nth of the number N of suction error occurring holders is set at three. First, component mounting device 10 executes the suction operation by lowering a Z1 holder and opening a Z1 valve by using holder A located at Z1. In addition, at approximately the same time as the suction operation being executed as described above, component mounting device 10 executes the suction operation by lowering a Z2 holder and opening a Z2 valve using holder E located at Z2 (an operation of driving corresponding selector valve 86 by corresponding valve driving device 46 at Z2 to cause holder flow path 42a in nozzle holder 42 to communicate with negative pressure flow path 83) (refer to FIG. 10(A)). Next, component mounting device 10 revolves each holder one pitch ahead, executes the suction operation by lowering the Z1 holder and opening the Z1 valve using holder B arriving at Z1, and determines whether a component is present at holder A using side camera 47 at Z1. In addition, at approximately the same time as the series of operations described above, component mounting device 10 executes the suction operation by lowering the Z2 holder and opening the Z2 valve using holder F arriving at Z2, and determines whether a component is present at holder E using side camera 48 at the Z2 (refer to FIG. 10(B)). Here, component mounting device 10 determines that there is no component P held by holder A (a suction error has occurred), determines that component P is held by holder E, and determines that the negative pressure is equal to the negative pressure threshold or greater (negative pressure threshold OK). Subsequently, component mounting device 10 revolves each holder one pitch ahead, skips the suction operation using holder C arriving at Z1, and determines whether a component is present at holder B. In addition, at approximately the same as the series of operations described above, component mounting device 10 skips the suction operation using holder G arriving at Z2 and determines whether a component is present at holder F (refer to FIG. 10(C)). Here, component mounting device 10 determines that there is no component P held by holder B, determines that component P is held at holder F, and determines that the negative pressure is less than the negative pressure threshold (negative pressure threshold NG). The reason that the suction operations using holder C and holder G are skipped is that, as described above, since the permissible maximum number Nth of the number N of suction error occurring holders is set at three, in the event that a further suction operation is executed in such a state that the suction error has occurred on holder A and whether a suction error has occurred on holders B, F is uncertain, there is a possibility that the number N of suction error occurring holders becomes four or greater, exceeding the permissible maximum number Nth. Then, component mounting device 10 revolves each holder one pitch ahead and skips the suction operation using holder D and the suction operation using holder H because the negative pressure is less than the negative pressure threshold (negative pressure threshold NG) (refer to FIG. 10(D)). If the negative pressure is equal to the negative pressure threshold or greater (negative pressure threshold OK), component mounting device 10 can execute the suction operation using only one of holder D and holder H. This is because even if the suction operation results in a suction error, the number N of suction error occurring holders does not exceed the permissible maximum number Nth in any way. Next, since holder A on which the suction error has occurred arrives at Z2 when component mounting device 10 revolves each holder one pitch ahead, component mounting device 10 executes the negative pressure recovery operation by closing the Z2 valve (refer to FIG. 10(E)). As a result, component mounting device 10 determines that the negative pressure is equal to the negative pressure threshold or greater (negative pressure threshold OK). Subsequently, since holder B on which the suction error has occurred arrives at Z2 when component mounting device 10 revolves each holder one pitch ahead, component mounting device 10 executes the negative pressure recovery operation by closing the Z2 valve (refer to FIG. 10(F)). Then, component mounting device 10 revolves each holder one pitch ahead and executes the suction operation by lowering the Z1 holder and opening the Z1 valve using holder G arriving at Z1. In addition, at approximately the same time as the series of operations described above, component mounting device 10 executes the suction operation by lowering the Z2 holder and opening the Z2 valve using holder C arriving at Z2 (refer to FIG. 10(G)). Next, component mounting device 10 revolves each holder one pitch ahead, executes the suction operation by lowering the Z1 holder and opening the Z1 valve using holder H arriving at Z1, and determines whether a component is present at holder G. In addition, at approximately the same time as the series of operations described above, component mounting device 10 executes the suction operation by lowering the Z2 holder and opening the Z2 valve using holder D arriving at Z2 and determines whether a component is present at holder C (refer to FIG. 10(H)). Here, component mounting device 10 determines that both holder G and holder C hold components P. Subsequently, component mounting device 10 revolves each holder on pitch ahead, executes the suction operation by lowering the Z1 holder and opening the Z1 valve using holder A arriving at Z1, and determines whether a component is present at holder H. In addition, component mounting device 10 determines whether a component is present at holder D (refer to FIG. 10(I)). Here, component mounting device 10 determines that component P is held by holder H and determines that component P is held by holder D. Then, component mounting device 10 revolves each holder one pitch ahead and executes the suction operation by lowering the Z1 holder and opening the Z1 valve using holder B arriving at Z1 (refer to FIG. 10(J)). In addition, component mounting device 10 revolves each holder one pitch ahead and determines whether a component is present at holder B (refer to FIG. 10(K)). Here, component mounting device 10 determines that component P is held by holder B. In this way, component mounting device 10 causes components P to be held by suction to all nozzle holders 42 (suction nozzles 44).

In the embodiments described above, as a determination for skipping the suction operation, component mounting device 10 determines whether the absolute value of the negative pressure in negative pressure flow path 83 is less than the negative pressure threshold and whether the number N of suction error occurring holders is less than the permissible maximum number Nth; however, either one of the determinations may be omitted.

In the embodiments described above, when determining that a suction error has occurred after the suction operation has been executed using nozzle holder 42 located at Z1, component mounting device 10 is described as executing the negative pressure recovery operation when nozzle holder 42 on which the suction error has occurred arrives at Z2 as a result of each holder 42 being revolved one pitch forward. However, when determining that a suction error has occurred at Z1, component mounting device 10 may execute the negative pressure recovery operation by returning nozzle holder 42 on which the suction error has occurred to Z1 by revolving each nozzle holder 42 in the opposite direction.

In the embodiments described above, mounting head 40 is described as including Z-axis driving devices 70, 75 at the two locations on the revolving locus of nozzle holders 42. However, mounting head 40 may have three or more Z-axis driving devices.

As described above, the component mounting device picks up a component by suction to mount the component on a target object and includes:

a negative pressure source configured to generate a negative pressure;

a nozzle configured to pick up the component by suction at a suction port;

a rotary head including a rotating body including multiple holders disposed in a circumferential direction, the holders each being configured to hold the nozzle and including a holder flow path formed in an interior space in such a manner as to communicate with the suction port of the nozzle;

a rotating device configured to rotate the rotational body so as to revolve the multiple holders in the circumferential direction;

multiple lifting and lowering devices configured to individually lift up and lower the holders, among the multiple holders, that are located in multiple predetermined revolving positions;

multiple selector valves provided in such a manner as to individually correspond to the multiple holders to make and break communications between the holder flow paths of the corresponding holders and the negative pressure source;

valve driving devices configured to drive the selector valves corresponding to the holders, among the multiple holders, that are located in the multiple predetermined revolving positions; and a control device configured to execute, when the component is requested to be picked up by suction, a suction operation in which the nozzle held by the holder located in either one of the multiple predetermined revolving positions is caused to suck the component by causing the lifting and lowering device and the valve driving device that correspond to the holder in question to lower the holder in question and to bring a state of the selector valve corresponding to the holder in question into a state where the selector valve switches to make the holder flow path in the holder in question communicate with the negative pressure source, a suction error determination determining whether a suction error has occurred in which the nozzle held by the holder in question fails to pick up the component by suction after the suction operation is executed, and, when the control device determines that a suction error has occurred, a negative pressure recovery operation in which, when the holder holding the nozzle on which the suction error has occurred is revolved to either of the multiple revolving positions, the valve driving device corresponding to the selector valve that corresponds to the holder in question is caused to bring the selector valve in question into a state where the selector valve switches to breaking communication between the holder flow path in the holder in question and the negative pressure source.

In the component mounting device of the present disclosure that is configured as described above, when a negative pressure from the negative pressure source is less than a predetermined negative pressure, the control device may stop executing the suction operation and resume executing the suction operation when the negative pressure from the negative pressure source is recovered by the negative pressure recovery operation. As a result, the negative pressure recovery operation and the suction operation can be executed efficiently, thereby making it possible to improve productivity.

In this case, the control device may update the predetermined negative pressure based on a result of the suction error determination. As a result, the shortage of a negative pressure from the negative pressure source can adequately be determined irrespective of individual difference in dimension and deterioration with time of the head.

In the component mounting device of the present disclosure, the control device may execute the negative pressure recovery operation when a negative pressure from the negative pressure source is less than a predetermined negative pressure. As a result, the negative pressure recovery operation can be executed with good efficiency.

In the component mounting device of the present disclosure, the control device may execute the suction operation in such a manner that the number of holders, which do not hold the components by suction and whose corresponding selector valve remains in a state enabling the holder flow path to communicate with the negative pressure source, does not exceed a predetermined number. As a result, the negative pressure from the negative pressure source can be prevented from decreasing greatly.

Further, in the component mounting device of the present disclosure, the multiple lifting and lowering devices may include a first lifting and lowering device configured to lift up and lower the holder, among the multiple holders, located in a first predetermined revolving position, and a second lifting and lowering device configured to lift up and lower the holder, among the multiple holders, located in a second predetermined revolving position;

the valve driving devices comprise a first valve driving device configured to drive the selector valve corresponding to the holder, among the multiple holders, located in the first predetermined revolving position and a second valve driving device configured to drive the selector valve corresponding to the holder, among the multiple holders, located in the second predetermined revolving position; and when the control device determines that the suction error occurs on the nozzle held by the holder located in the first predetermined revolving position after the control device has executed the suction operation using the nozzle held by the holder in question, the control device executes the negative pressure recovery operation when the holder holding the nozzle on which the suction error occurs revolves to arrive at the second predetermined revolving position. As a result, a period of time from the determination that a suction error has occurred to the execution of the negative pressure recovery operation can be shortened, thereby making it possible to prevent the negative pressure in the negative pressure source from decreasing.

In this case, the control device may be configured to execute, at approximately the same time, the suction operation, comprising a first suction operation in which the component is sucked to be held to the nozzle held by the holder located in the first predetermined revolving position by causing the first lifting and lowering device and the first valve driving device to lower the holder in question and bring the selector valve corresponding to the holder in question into a state where the selector valve selects communication between the holder flow path and the negative pressure source, and a second suction operation in which the component is sucked to be held to the nozzle held by the holder located in the second predetermined revolving position by causing the second lifting and lowering device and the second valve driving device to lower the holder in question and bring the selector valve corresponding to the holder in question into a state where the selector valve selects communication between the holder flow path and the negative pressure source. As a result, a large number of components can be held by suction by the nozzles within a short period of time, thereby making it possible to further improve productivity.

The present disclosure is not limited in any way to the embodiments described above, and hence, needless to say, the present disclosure can be carried out in various forms without departing from the technical scope of the present disclosure.

INDUSTRIAL APPLICABILITY

The present disclosure can be applied in a manufacturing industry for component mounters or the like.

REFERENCE SIGNS LIST

1 mounting system, 10 component mounting device, 12 casing, 22 component, 24 board conveyance device, 26 part camera, 30 XY robot, 31 X-axis guide rail, 32 X-axis slider, 33 Y-axis guide rail, 34 Y-axis slider, 36 X-axis motor, 37 X-axis position sensor, 38 Y-axis motor, 39 Y-axis position sensor, 40 mounting head, 41 head main body, 41a radial flow path, 42 nozzle holder, 42a holder flow path, 44 suction nozzle, 45,46 valve driving device, 47,48 side camera, 50 R-axis driving device, 51 R-axis motor, 52 R shaft, 53 transmission gear, 55 R-axis position sensor, 60 Q-axis driving device, 61 Q-axis motor, 62 cylindrical member, 62a gear, 63 transmission gear, 64 Q-axis gear, 65 Q-axis position sensor, 70 first Z-axis driving device, 71,76 Z-axis motor, 72,77 Z-axis slider, 73,78 Z-axis position sensor, 75 second Z-axis driving device, 80 pressure supply device, 81 negative pressure source, 82 positive pressure source, 83 negative pressure flow path, 84 positive pressure flow path, 85 atmospheric pressure flow path, 86 selector valve, 87 valve operation lever, 88 pressure sensor, 90 control device, 91 CPU, 92 ROM 93 HDD, 94 RAM, 95 input/output interface, 96 bus, 100 management device, 101 CPU, 102 ROM, 103 HDD, 104 RAM, 105 input/output interface, 107 input device, 108 display, P component, S board.

The invention claimed is:

1. A component mounting device configured to pick up a component by suction to mount the component on a target object, the component mounting device comprising:
   a negative pressure source configured to generate a negative pressure;
   a nozzle configured to pick up the component by suction at a suction port;
   a rotary head including a rotating body including multiple holders disposed in a circumferential direction, the holders each being configured to hold the nozzle and including a holder flow path formed in an interior space in such a manner as to communicate with the suction port of the nozzle;
   a rotating device configured to rotate the rotational body so as to revolve the multiple holders in the circumferential direction, the rotating device including a motor, a shaft extending in an axial direction from a center axis of a main body of the rotary head, and a transmission gear that transmit rotation of the motor to the shaft;
   multiple lifting and lowering devices configured to individually lift up and lower the holders, among the multiple holders, that are located in multiple predetermined revolving positions;
   multiple selector valves provided in such a manner as to individually correspond to the multiple holders to make and break communications between the holder flow paths of the corresponding holders and the negative pressure source;
   valve driving devices configured to drive the selector valves corresponding to the holders, among the multiple holders, that are located in the multiple predetermined revolving positions; and
   a control device including a processor which
      executes a suction operation in which the nozzle held by the holder located in one of the multiple predetermined revolving positions is caused to suck the component by causing the lifting and lowering device and the valve driving device that correspond to the holder in question to lower the holder in question, and bring a state of the selector valve corresponding to the holder in question into a state where the selector valve switches to make the holder flow path in the holder in question communicate with the negative pressure source, when the component is requested to be picked up by suction, determines whether a suction error has occurred in which the nozzle held by the holder in question fails to pick up the component by suction after the suction operation is executed, and when the control device determines that a suction error has occurred, executes a negative pressure recovery operation in which, when the holder holding the nozzle on which the suction error has occurred is revolved to one of the multiple predetermined revolving positions, the valve driving device corresponding to the selector valve that corresponds to the holder in question is caused to close the selector valve in question so that the selector valve breaks communication between the holder flow path in the holder in question and the negative pressure source.

2. The component mounting device according to claim 1, wherein the control device stops executing the suction operation when a negative pressure from the negative pressure source is less than a predetermined negative pressure, and the control device resumes executing the suction operation when the negative pressure from the negative pressure source is recovered by the negative pressure recovery operation.

3. The component mounting device according to claim 2, wherein the control device updates the predetermined negative pressure based on a result of the suction error determination.

4. The component mounting device according to claim 1, wherein the control device executes the negative pressure recovery operation when a negative pressure from the negative pressure source is less than a predetermined negative pressure.

5. The component mounting device according to claim 1, wherein the control device executes the suction operation in such a manner that the number of holders which do not hold the component by suction and whose corresponding selector valve remains in a state enabling the holder flow path to communicate with the negative pressure source does not exceed a predetermined number.

6. The component mounting device according to claim 1, wherein the multiple lifting and lowering devices comprise a first lifting and lowering device configured to lift up and lower the holder, among the multiple holders, located in a first predetermined revolving position, and a second lifting and lowering device configured to lift up and lower the holder, among the multiple holders, located in a second predetermined revolving position;

wherein the valve driving devices comprise a first valve driving device configured to drive the selector valve corresponding to the holder, among the multiple holders, located in the first predetermined revolving position and a second valve driving device configured to drive the selector valve corresponding to the holder, among the multiple holders, located in the second predetermined revolving position; and wherein when the control device determines that the suction error occurs on the nozzle held by the holder located in the first predetermined revolving position after the control device has executed the suction operation using the nozzle held by the holder in question, the control device executes the negative pressure recovery operation when the holder holding the nozzle on which the suction error occurs revolves to arrive at the second predetermined revolving position.

7. The component mounting device according to claim 6, wherein the control device executes the suction operation comprising:

a first suction operation in which the component is sucked to be held to the nozzle held by the holder located in the first predetermined revolving position by causing the first lifting and lowering device and the first valve driving device to lower the holder in question and bring the selector valve corresponding to the holder in question into a state where the selector valve selects communication between the holder flow path and the negative pressure source; and a second suction operation in which the component is sucked to be held to the nozzle held by the holder located in the second predetermined revolving position by causing the second lifting and lowering device and the second valve driving device to lower the holder in question and bring the selector valve corresponding to the holder in question into a state where the selector valve selects communication between the holder flow path and the negative pressure source, wherein the control device executes the first suction operation and the second suction operation at approximately the same time.

8. The component mounting device according to claim 1, wherein each of the lifting and lowering devices includes a slider and a motor configured to lift up and lower the slider, the slider being disposed above the holders.

9. The component mounting device according to claim 1, further comprising:

a side camera which capture an image of a vicinity of a distal end of the nozzle held by the holder in question, wherein the control device determines whether the suction error has occurred based on the image.

* * * * *